(12) United States Patent
Liu et al.

(10) Patent No.: US 7,141,269 B2
(45) Date of Patent: Nov. 28, 2006

(54) MOLDING TECHNIQUE FOR COPPER INTERCONNECTING WIRES BY ELECTROCHEMICAL DISPLACEMENT DEPOSITION ON THE PRE-SHAPED METAL LAYER

(75) Inventors: Don-Gey Liu, Taichung (TW);
Tsong-Jen Yang, Taichung (TW);
Chin-Hao Yang, Taipei (TW);
Hong-Yuan Hsu, Daan Hsiang (TW);
Wen Luh Yang, Chingshuei Jen (TW);
Giin-Shan Chen, Taichung (TW)

(73) Assignee: Feng Chia University, Taichung (TW)

( * ) Notice: Subject to any disclaimer, the term of this patent is extended or adjusted under 35 U.S.C. 154(b) by 580 days.

(21) Appl. No.: 10/725,552

(22) Filed: Dec. 3, 2003

(65) Prior Publication Data

US 2004/0222558 A1 Nov. 11, 2004

(30) Foreign Application Priority Data

Dec. 3, 2002 (TW) ............................... 91134994 A

(51) Int. Cl.
*B05D 5/12* (2006.01)
*C23C 14/00* (2006.01)
(52) U.S. Cl. .................. 427/99.5; 427/97.7; 204/192.1
(58) Field of Classification Search .................. 205/70; 204/192.1, 192.15; 427/97.7, 99.5
See application file for complete search history.

(56) References Cited

U.S. PATENT DOCUMENTS

| 5,308,796 A | * | 5/1994 | Feldman et al. ............. 438/655 |
| 6,261,637 B1 | * | 7/2001 | Oberle ........................ 438/656 |

* cited by examiner

*Primary Examiner*—Nam Nguyen
*Assistant Examiner*—Luan V. Van
(74) *Attorney, Agent, or Firm*—Rosenberg, Klein & Lee

(57) ABSTRACT

A molding technique for copper interconnecting wires by electrochemical displacement deposition on the pre-shaped metal layer in accordance with the present invention is used to form an adhering layer on a substrate and a sacrificial layer on the adhering layer. The sacrificial layer is patterned according to the copper interconnecting wires and displaced to form the copper interconnecting wires in a specific chemical solution.

8 Claims, 5 Drawing Sheets

MOLDING TECHNIQUE FOR COPPER INTERCONNECTING WIRES BY ELECTROCHEMICAL DISPLACEMENT DEPOSITION ON THE PRE-SHAPED METAL LAYER

BACKGROUND OF THE INVENTION

1. Field of the Invention

The present invention relates to molding technique for copper interconnecting wires by electrochemical displacement deposition on the pre-shaped metal layer, and more particularly to a molding technique for copper interconnecting wires by electrochemical displacement deposition on the pre-shaped metal layer for ultra large scale integrated circuit (ULSI).

2. Description of Related Art

The conventional methods of copper growth for very large scale integrated circuit (VSLI) and ULSI respectively comprise physical vapor deposition (PVD), chemical vapor deposition (CVD), electroplating, electroless deposition, etc., wherein the copper formed by other methods. However, the step coverage of the copper grown in the grooves in the surface of wafer by PVD is not even, and the copper grown by CVD has a good coverage, but not pure such that the copper growth by CVD has a resistance higher than that of the copper grown by PVD. Furthermore, the prescription of dry etching cannot create a reactant with high volatility such that the copper film cannot be etched and formed leading wires on the surface of the wafer.

Consequently, major manufacturers use damascene process to grow copper. With reference to FIG. 4, an underlying dielectric layer (72) is formed on a substrate (71). Multiple grooves (73) are defined in the underlying dielectric layer (72) by photolithography etching and correspond to the copper interconnecting wires. A copper layer (74) is electroplated on the underlying dielectric layer (72) so that the copper interconnecting wires (741) is formed in the multiple grooves (73) after chemical mechanical polishing (CMP) for grinding the unnecessary portion of the copper layer (74).

However, the manufacturer must grind the copper layer (74) one after one by CMP in the current technique. Consequently, the conventional method for forming the copper interconnecting wires by CMP takes a lot of manufacturing cost and has an output in a low rate, and needs to be advantageously altered.

With reference to FIG. 5, for solving the above problems of damascene process, an electrochemical displacement deposition (EDD) is used. As shown in FIG. 5, an underlying dielectric layer (82) is piled upon a substrate (81) and multiple grooves (821) are defined in the top of the underlying dielectric layer (82) by etching. A mask (83) is coated on the surface of the underlying dielectric layer (82) and a poly-silicone layer (84) is piled on the mask (83). The poly-silicone layer (84) is ground to be flushed with the mask (83) so that each groove (821) is fill with poly-silicone. Finally, the solution containing hydrofluoric acid (BOE) and cupric sulphate ($CuSO_4$) is used to execute the electrochemical displacement deposition to the remained poly-silicone layer (84) to reduce the copper ions in the solution and collect on the surface of the mask (83). The reduced copper ions are used as the copper interconnecting wires. The chemical formula of the above chemical reaction is followed:

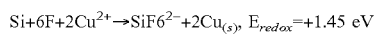

$Si+6F+2Cu^{2+} \rightarrow SiF_6^{2-}+2Cu_{(s)}$, $E_{redox}=+1.45$ eV

However, the copper grown by the method of the EDD has a high resistance and is difficult to be adhered on the surface of the wafer.

The present invention has arisen to mitigate and/or obviate the disadvantages of the conventional methods for growing copper interconnecting wire.

SUMMARY OF THE INVENTION

The main objective of the present invention is to provide an improved molding technique for copper interconnecting wires by electrochemical displacement deposition on the pre-shaped metal layer for providing a good connection between the copper interconnecting wires and the adhering layer, and reducing the resistance value of the copper interconnecting wires.

To achieve the objective, the molding technique in accordance with the present invention comprising the following steps:

step 1: preparing a silicone wafer that is used as a substrate;

step 2: forming a wet oxide on the substrate by a stove in high temperature;

step 3: forming a layer of $Si_3N_4$ and used as a corrode-proof layer;

step 4: adding $N_2$ into a sputtering apparatus to form TiN on the corrode-proof layer having a thickness about 100 Å and used as a adhering layer;

step 5: forming a layer on the adhering layer in the sputtering apparatus and used as a sacrificial layer, the adhering layer being used to enhance the connection between the sacrificial layer and the corrode-proof layer;

step 6: patterning the sacrificial layer and cutting the unnecessary portion relative to the copper interconnecting wires, wherein the patterned sacrificial layer in used as a mold for displacement and amassing the copper interconnecting wires;

step 7: preparing reaction solution;

step 8: putting the substrate with the mold into the reaction solution; and step 9: taking the substrate from the reaction solution and then the copper interconnecting wires are formed on the substrate due to the mold on the sacrificial layer.

Further benefits and advantages of the present invention will become apparent after a careful reading of the detailed description with appropriate reference to the accompanying drawings.

DETAILED DESCRIPTION OF THE INVENTION

Figure 1:
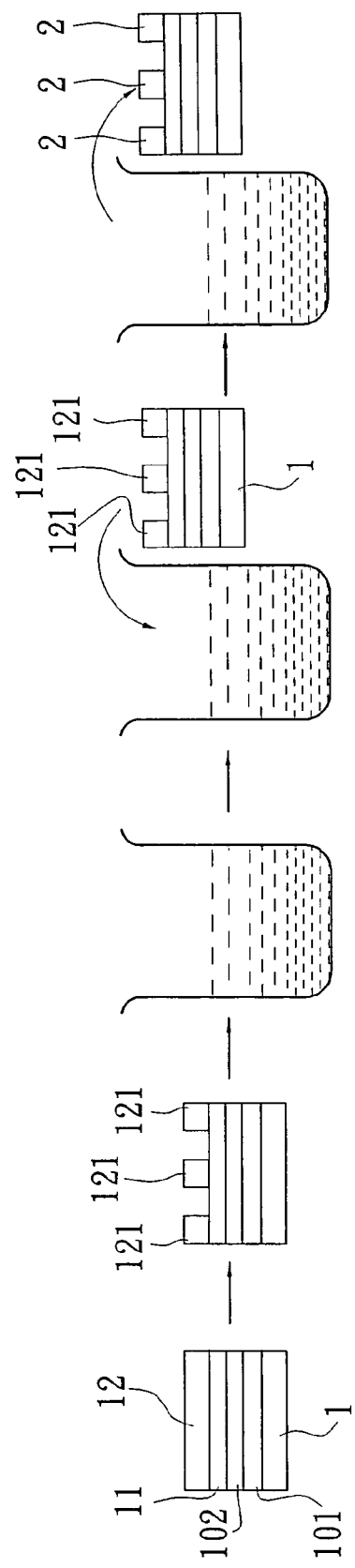
FIG. 1 is a flow chart of a molding technique for copper interconnecting wires by electrochemical displacement deposition on the pre-shaped metal layer in accordance with the present invention.
Figure 2:
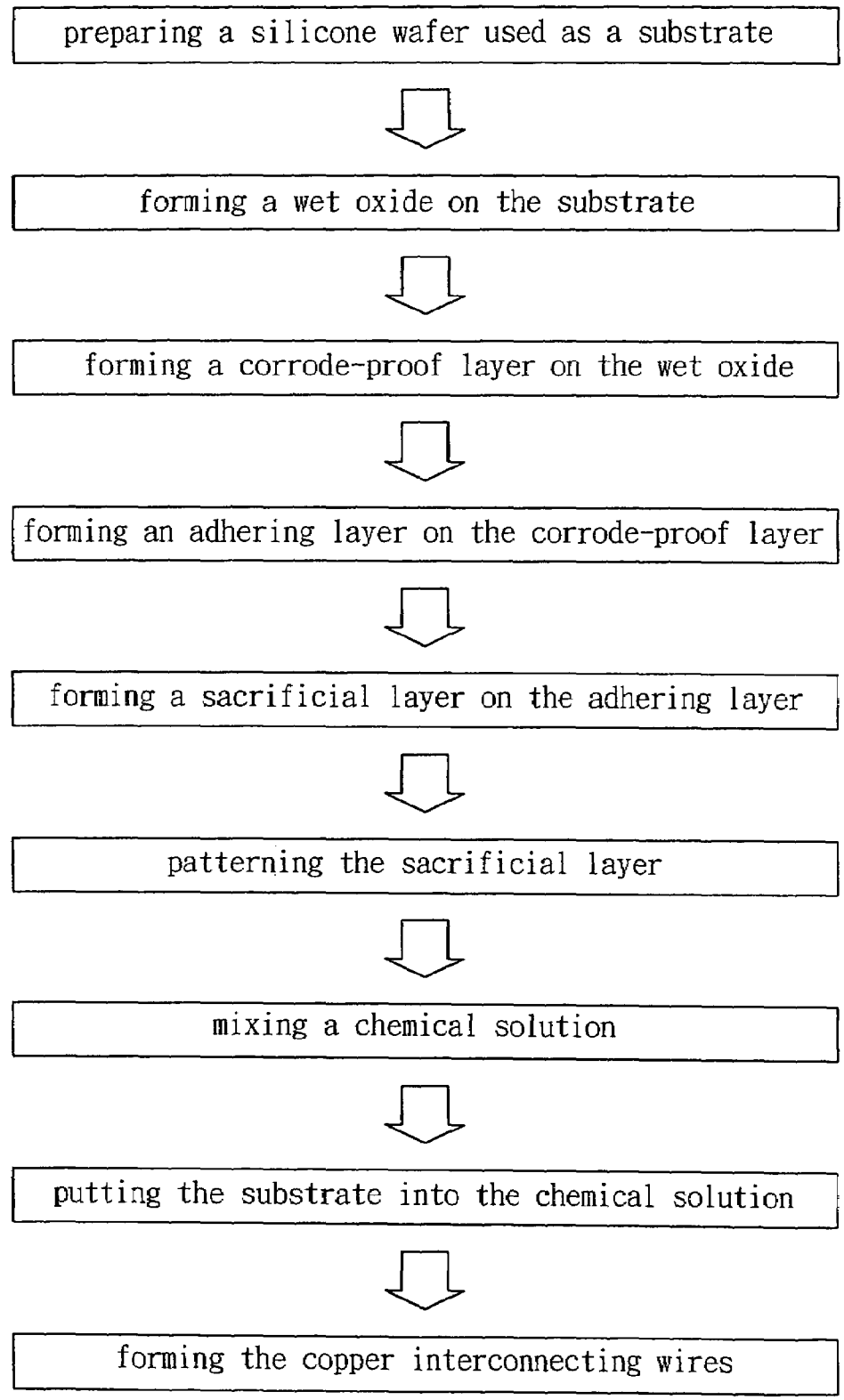
FIG. 2 is a block diagram of a molding technique for copper interconnecting wires by electrochemical displacement deposition on the pre-shaped metal layer in accordance with the present invention.

Referring to the drawings and initially to FIGS. 1 and 2, a molding technique for copper interconnecting wires by electrochemical displacement deposition on the pre-shaped metal layer in accordance with the present invention is used to form an adhering layer (11) on a substrate (1) and a sacrificial layer (12) on the adhering layer (11). The sacrificial layer (12) is patterned according to the copper interconnecting wires and displaced to form the copper interconnecting wires in a specific chemical solution.

The molding technique for copper interconnecting wires by electrochemical displacement deposition on the pre-shaped metal layer comprises the following steps:

Step 1: preparing a silicone wafer that is used as the substrate (1) of the present invention;

Step 2: forming a wet oxide (101) by a stove in high temperature, wherein the wet oxide (101) has a thickness about 1500 Å for insulating;

Step 3: forming a layer of $Si_3N_4$ having a thickness about 500 Å and used as a corrode-proof layer (102), wherein the layer of $Si_3N_4$ is formed by plasma enhanced chemical vapor deposition (PECVD);

Step 4: adding $N_2$ into a sputtering apparatus to form TiN on the corrode-proof layer (102) having a thickness about 100 Å and used as the adhering layer (11), in the preferred embodiment of the present invention, the process for forming the adhering layer (11) tacking about eighty-six seconds;

Step 5: forming a layer of Ti on the adhering layer (11) in the sputtering apparatus, the layer of Ti having a thickness about 3000 Å and used as the sacrificial layer (12), the adhering layer (11) being used to enhance the connection between the sacrificial layer (12) and the corrode-proof layer (102);

Step 6: patterning the sacrificial layer (12) and cutting the unnecessary portion by lithography relative to the copper interconnecting wires, wherein the patterned sacrificial layer (12) in used as a mold (121) for displacement and amassing the copper interconnecting wires;

Step 7: adding 40 milliliters hydrofluoric acid (BOE) and 4 grams cupric sulphate ($CuSO_4$) into one liter deionized water for forming the reaction solution;

Step 8: putting the substrate (1) with the mold (121) into the reaction solution for eight minutes; and Step 9: taking the substrate (1) from the reaction solution and then the copper interconnecting wires are formed on the substrate (1) due to the mold (121) on the sacrificial layer (12) of Ti.

The Ti of the sacrificial layer (12) can be displaced by Ta and the sacrificial layer (12) can further be patterned by photolithography etching.

The corrode-proof layer (102) formed by $Si_3N_4$ can effectively prevent the substrate (1) from being corroded due to the BOE.

The copper grown by the conventional method of damascene process cannot be etched by lithography or photolithography so that the copper needs to be ground. However, in the present invention, the Ti sacrificial layer (12) is patterned to form a mold (121) relative to the copper interconnecting wires (2) and the copper grows corresponding to the mold (121). Consequently, the grinding process is unnecessary to the method in accordance with the present invention.

Furthermore, the sacrificial layer (12) is formed by Ti or Ta that is adhesive and the Ti and Ta can prevent the copper atom from being spread into the wet oxide (101), the corrode-proof layer (102) and the substrate (1) to influence the transistor, and promote the connection between the copper interconnecting wires (2) and the adhering layer (11).

Figure 3:
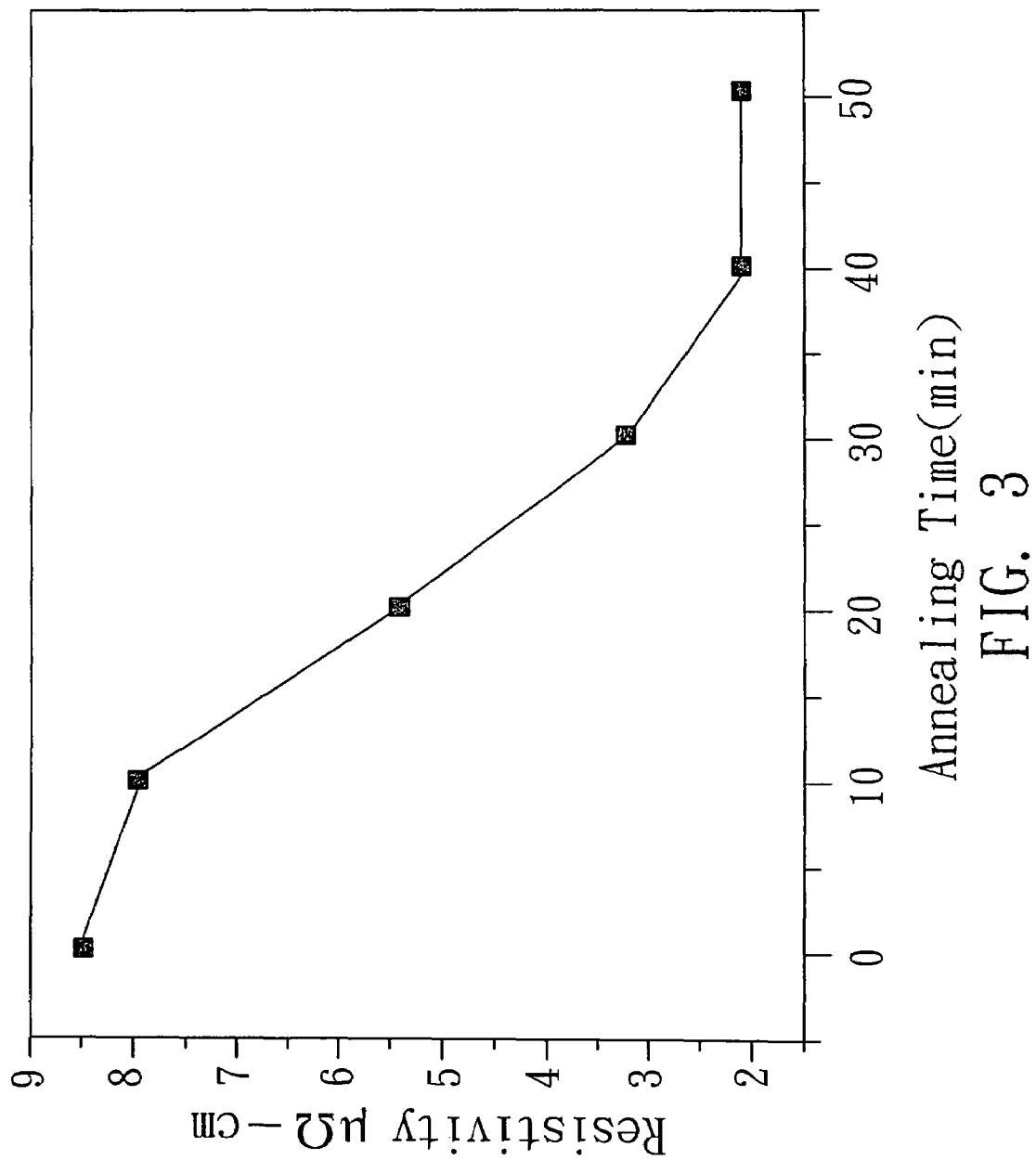
FIG. 3 is a function view that the effect of the annealing time on the sheet resistance of the copper film formed by the electrochemical displacement reaction, wherein the environment gas during annealing is $H_2$.
Figure 4:
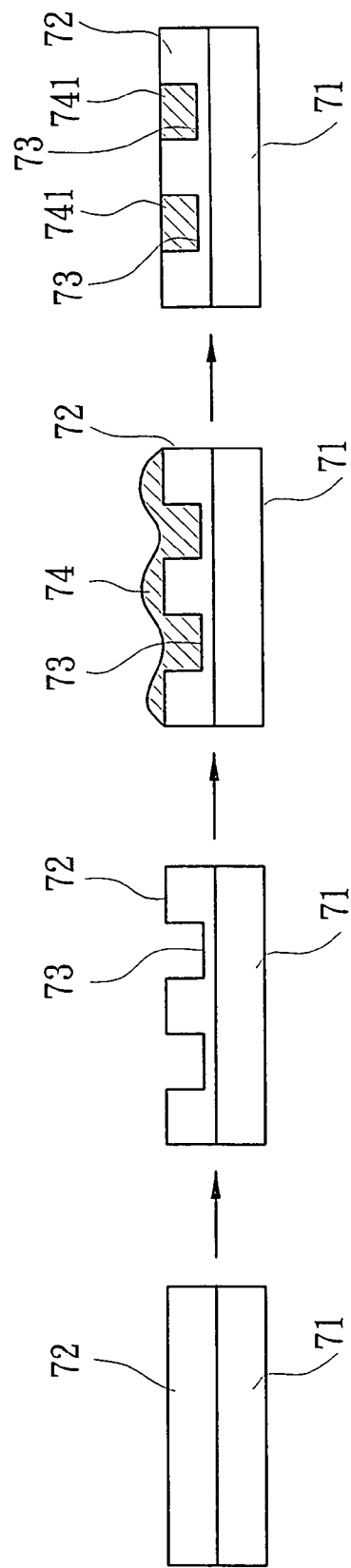
FIG. 4 is a flow chart of a conventional damascene process for growing copper.
Figure 5:
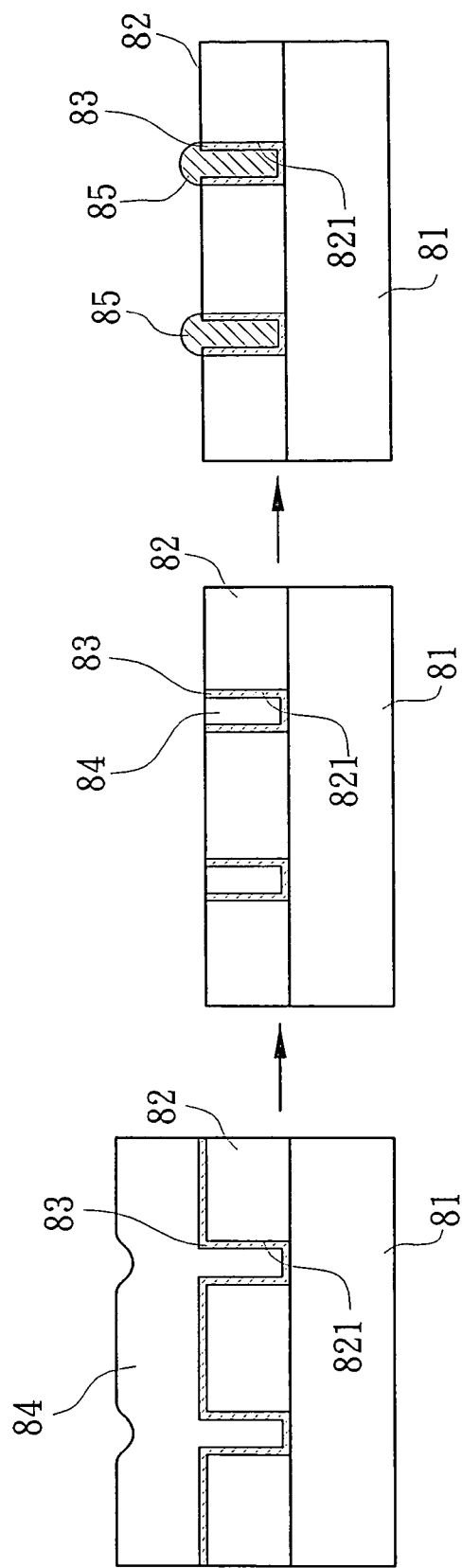
FIG. 5 is a flow chart of a conventional electrochemical displacement deposition (EDD) for growing copper.

The copper interconnecting wires (2) formed by the method of the present invention have a resistance value about 8.5 μ Ω-cm that is very closed to that of aluminum interconnecting wires. With reference to FIG. 3, the resistance value of the copper interconnecting wires (2) will be reduced to 1.67 μ Ω-cm that is very closed to the ideal resistance value of copper.

As described above, the method in accordance with the present invention can provide a good connection between the copper interconnecting wires (2) and the adhering layer (11) and reduce the resistance value of the copper interconnecting wires (2). Consequently, the present invention has arisen to obviate the disadvantages of the conventional methods for growing copper interconnecting wires.

Although the invention has been explained in relation to its preferred embodiment, it is to be understood that many other possible modifications and variations can be made without departing from the spirit and scope of the invention as hereinafter claimed.

What is claimed is:

1. A molding technique for copper interconnecting wires by electrochemical displacement deposition on the pre-shaped metal layer comprising the following steps:

step 1: preparing a silicone wafer that is used as a substrate;

step 2: forming a wet oxide on the substrate by a stove in high temperature;

step 3: forming a layer of $Si_3N_4$ and used as a corrode-proof layer;

step 4: adding $N_2$ into a sputtering apparatus to form TiN on the corrode-proof layer having a thickness about 100 Å and used as an adhering layer;

step 5: forming a layer on the adhering layer in the sputtering apparatus and used as a sacrificial layer, the adhering layer being used to enhance the connection between the sacrificial layer and the corrode-proof layer;

step 6: patterning the sacrificial layer and cutting the unnecessary portion relative to the copper interconnecting wires, wherein the patterned sacrificial layer is used as a mold for displacement and amassing the copper interconnecting wires;

step 7: mixing a reaction solution;

step 8: putting the substrate with the mold into the reaction solution; and step 9: taking the substrate from the reaction solution and then the copper interconnecting wires are formed on the substrate due to the mold on the sacrificial layer.

2. The molding technique as claimed in claim 1, wherein the sacrificial layer is formed of Ti.

3. The molding technique as claimed in claim 1, wherein sacrificial layer is formed of Ta.

4. The molding technique as claimed in claim 1, wherein the sacrificial layer is patterned by lithography.

5. The molding technique as claimed in claim 1, wherein the sacrificial layer is patterned by photolithography etching.

6. The molding technique as claimed in claim 1, wherein the sacrificial layer is formed on the adhering layer by sputtering.

7. The molding technique as claimed in claim 1, wherein the reaction solution contains 40 milliliters hydrofluoric acid (BOE) and 4 grams cupric sulphate ($CuSO_4$) in one liter deionized water.

8. The molding technique as claimed in claim 6, wherein the sacrificial layer has a thickness about 3000 Å.

* * * * *